United States Patent
Jelonnek et al.

(10) Patent No.: US 10,931,347 B2
(45) Date of Patent: Feb. 23, 2021

(54) LINEARIZING POWER AMPLIFIERS' OUTPUTS IN MULTI-ANTENNA SYSTEM

(71) Applicant: Nokia Solutions and Networks Oy, Espoo (FI)

(72) Inventors: Bjoern Jelonnek, Ulm (DE); Gunter Wolff, Laupheim (DE); Charles Nader, Ulm (DE); Frank Dechen, Neu-Ulm (DE)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 16/313,616

(22) PCT Filed: Jul. 3, 2017

(86) PCT No.: PCT/EP2017/066472
§ 371 (c)(1),
(2) Date: Dec. 27, 2018

(87) PCT Pub. No.: WO2018/007303
PCT Pub. Date: Jan. 11, 2018

(65) Prior Publication Data
US 2020/0212975 A1    Jul. 2, 2020

(30) Foreign Application Priority Data

Jul. 4, 2016    (EP) .................................... 16177724

(51) Int. Cl.
*H04B 7/06*       (2006.01)
*H03F 1/32*       (2006.01)
(Continued)

(52) U.S. Cl.
CPC ......... *H04B 7/0617* (2013.01); *H03F 1/3241* (2013.01); *H03F 3/245* (2013.01);
(Continued)

(58) Field of Classification Search
CPC .... H03F 1/3241; H03F 1/3282; H03F 1/3252; H04B 1/0475; H04B 7/0617
See application file for complete search history.

(56) References Cited

U.S. PATENT DOCUMENTS

| 2010/0087227 A1 | 4/2010 | Francos et al. ............ 455/562.1 |
| 2011/0235749 A1 | 9/2011 | Kenington .................... 375/296 |

(Continued)

FOREIGN PATENT DOCUMENTS

| EP | 2 204 903 A1 | 7/2010 |
| EP | 2 822 242 A1 | 1/2015 |
| KR | 2012-0098506 A | 9/2012 |

*Primary Examiner* — Kevin Kim
(74) *Attorney, Agent, or Firm* — Harrington & Smith

(57) ABSTRACT

Linearizing Power Amplifiers' Outputs in Multi-Antenna System There is provided power efficient and simple structure for linearizing power amplifiers' outputs in multi-antenna beamforming systems. Beamforming factors are obtained for controlling transmission beams of the antennas in an analogue/hybrid beamforming system. At least one power amplifier model is determined on the basis of the power amplifiers' outputs and the beamforming factors. Predistortion parameters, for feeding a predistorted signal to power amplifiers for linearizing the power amplifiers' outputs, are determined such that after the operating parameters of the power amplifiers have been adjusted, errors in power amplifiers' outputs are reduced.

19 Claims, 3 Drawing Sheets

(51) Int. Cl.
 *H03F 3/24* (2006.01)
 *H04B 1/04* (2006.01)
(52) U.S. Cl.
 CPC ..... *H04B 1/0475* (2013.01); *H03F 2200/451* (2013.01); *H03F 2201/3215* (2013.01); *H04B 2001/0425* (2013.01)

(56) References Cited

U.S. PATENT DOCUMENTS

| | | |
|---|---|---|
| 2012/0219048 A1 | 8/2012 | Camuffo et al. |
| 2012/0328050 A1 | 12/2012 | Bai et al. ................. 375/297 |
| 2015/0103952 A1 | 4/2015 | Wang et al. |
| 2017/0279470 A1* | 9/2017 | Lee ................. H03F 3/195 |

* cited by examiner

LINEARIZING POWER AMPLIFIERS' OUTPUTS IN MULTI-ANTENNA SYSTEM

CROSS REFERENCE TO RELATED APPLICATION

This patent application is a U.S. National Stage application of International Patent Application Number PCT/EP2017/066472 filed Jul. 3, 2017, which is hereby incorporated by reference in its entirety, and claims priority to EP 16177724.8 filed Jul. 4, 2016.

FIELD

The embodiments relate to linearizing power amplifiers' outputs in a multi-antenna system and more particularly to multi-antenna systems applying analogue/hybrid beamforming.

BACKGROUND

In radio modules based on multi-antenna systems, the necessity of having dedicated signals to each antenna pipe for the purpose of linearization, equalization and alarming/monitoring is widely accepted. This is a design challenge in today's 5G radio concepts. However, due to the targeted high number of antenna and high integration, in a multi-antenna system according to a hybrid beamforming concept, a single digital signal processing, D/A conversion, frequency conversion and pre-amplifier path should serve multiple antennas that are differentiated due to the use of phase shifters and eventually attenuators. When digital pre-distortion (DPD) is used every DPD unit would have to linearize multiple power amplifiers with different magnitudes. The number of DPD units for the antennas are high. Moreover, the power consumption of the multi-antenna system is increased with the number of DPD units.

BRIEF DESCRIPTION

An object of the present invention is to provide a method and an apparatus for implementing the method so as to solve at least part of the above problems. The objects of the invention are achieved by a method, an apparatus and a computer program which are characterized by what is stated in the independent claims. The preferred embodiments of the invention are disclosed in the dependent claims.

Some embodiments provide power efficient and simple structure for linearizing power amplifiers' outputs in multi-antenna beamforming systems. Further advantages may comprise bandwidth increase of radio systems and enabling use of high-order modulation schemes with higher peak to average ratio which increase transmission throughput.

BRIEF DESCRIPTION OF THE DRAWINGS

In the following the invention will be described in greater detail by means of preferred embodiments with reference to the attached drawings, in which.

DETAILED DESCRIPTION OF THE INVENTION

Figure 1:
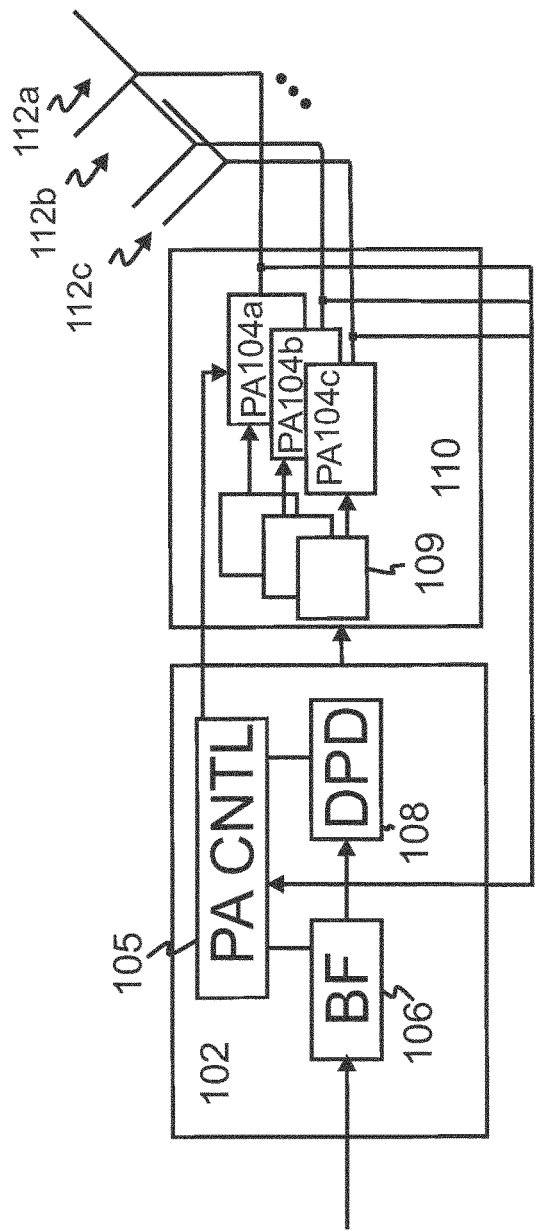
FIG. 1 illustrates architecture of analogue/hybrid beamforming system for a multi-antenna system, according to an embodiment.

FIG. 1 illustrates architecture of analogue/hybrid beamforming system for a multi-antenna system, according to an embodiment. The architecture provides power efficient and simple structure for linearizing power amplifiers' outputs and making the PAs more similar with each other. The architecture may represent structural and/or functional blocks of an apparatus according to an embodiment.

The analogue/hybrid beamforming system may serve for adapting transmission beams of antennas for radio transmissions in the multi-antenna system. Examples of transmissions in the multi-antenna system comprise Multiple Input Multiple Output (MIMO) and Multiple Input Single Output (MISO) transmissions.

The architecture comprises a beamforming unit (BF) 106 capable of determining beamforming factors for controlling transmission beams of antennas 112a, 112b, 112c in an analogue/hybrid beamforming system; parallel power amplifiers 104a, 104b, 104c controllable by the beamforming factors; phase and magnitude shifters 109 prior to the parallel power amplifiers; a power amplifier control unit (PACNTL) 105 capable of determining operating parameters for the power amplifiers on the basis of beamforming factors; a digital predistortion unit (DPD) 108 controllable by a single predistortion model for feeding a predistorted signal to the parallel power amplifiers for linearizing the power amplifiers' outputs. The phase and magnitude shifters are arranged to adjust the phase and magnitude of the radio signals fed to the parallel power amplifiers. The PA CNTL may be connected to the DPD, the BF and the power amplifiers' outputs to cause one or more functionalities described in various embodiments described herein. In this way predistortion performed by the digital predistortion unit may be adjusted on the basis of the power amplifiers' outputs. In an example, the architecture may comprise a digital signal processing (DSP) section 102 and an analogue signal processing (ASP) section 110. The DSP may provide baseband signal processing of transmissions and the ASP may provide signal processing in one or more higher frequency bands that may comprise an intermediate frequency and a radio frequency for communications by the antennas 104a, 104b, 104c. The DSP may comprise a digital beamforming unit 106 and a digital predistortion (DPD) unit 108, and the ASP may comprise analogue PAs. PA outputs from the ASP may be converted to digital signals by one or more Digital-to-Analogue Converters (DACs).

In an embodiment, at least part of the power amplifiers' 104a, 104b, 104c output signals are combined into a combined power amplifiers' output signal for measuring the combined power amplifiers' output signal. In this way the power amplifier model may be determined.

Figure 2:
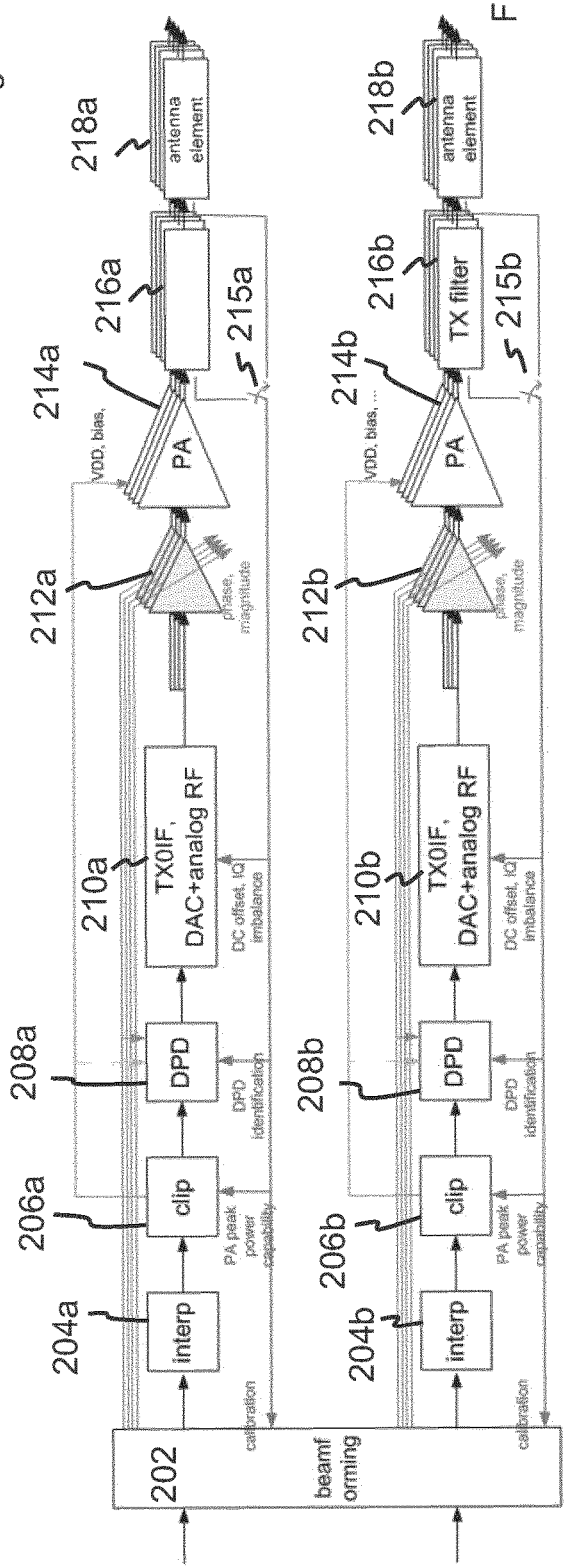
FIG. 2 an example of analogue/hybrid beamforming system according to an embodiment.

FIG. 2 an example of analogue/hybrid beamforming system according to an embodiment. The system may follow the architecture illustrated in FIG. 1. The system may comprise a DSP section comprising digital signal processing units 202 to 208 and an ASP section comprising analogue signal processing units 210 to 218. The DSP section may comprise an interpolation unit 204a, 204b, a power amplifier control unit 206a, 206b, a digital predistortion unit for the antennas 218a, 218b. The ASP section may comprise DAC and frequency conversion unit 210a, 210b, phase and magnitude shifters 212a, 212b prior to power amplifiers, parallel power amplifiers 214a, 214b controllable by the beamforming factors. The power amplifiers outputs may be fed to the antennas 218a, 281b. Filters 216a, 216b may be arranged at the power amplifiers' outputs for filtering the signal output from the power amplifiers.

The phase and magnitude shifters may be arranged to adjust the phase and magnitude of the radio signals fed to the power amplifiers.

The power amplifier control unit may be connected to the power amplifiers and to the predistortion unit and capable of determining operating parameters for the power amplifiers. The power amplifier control unit may be capable of determining operating parameters of the power amplifiers on the basis of beamforming factors. The operating parameters comprise a supply voltage/current or bias voltage/current.

The digital predistortion unit for the antennas may be controllable by a single predistortion model for feeding a predistorted signal to the parallel power amplifiers for linearizing the power amplifiers' outputs and said predistortion unit is connected to the beamforming unit and the power amplifiers' outputs.

In an embodiment, power amplifiers' 214a, 214b outputs may be grouped in different categories based on the respective usage of the power amplifiers' outputs or target functionalities.

In an embodiment, each group of power amplifiers' outputs may be selectable by an Radio Frequency (RF) switch 215a, 215b for measuring the output.

Figure 3:
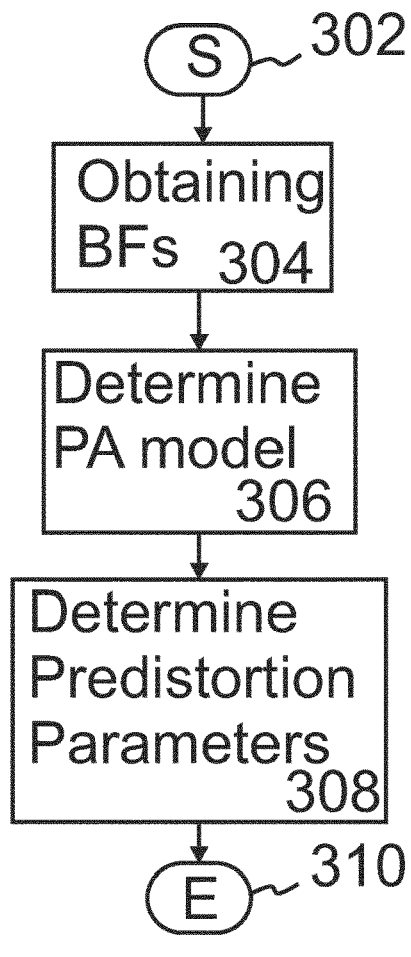
FIG. 3 illustrates a method for linearizing power amplifiers' outputs in an analogue/hybrid beamforming system, according to an embodiment.

FIG. 3 illustrates a method for linearizing power amplifiers' outputs in an analogue/hybrid beamforming system, according to an embodiment. The method may be performed by an apparatus according to FIG. 1 or 2, for example.

The method may start 302, when the analogue/hybrid beamforming system is operational and power amplifiers' outputs may be obtained.

Beamforming factors may be obtained 304 for controlling transmission beams of the antennas.

At least one power amplifier model may be determined 306 on the basis of the power amplifiers' outputs and the beamforming factors. The power amplifier outputs may be obtained from the power amplifiers controlled on the basis of the determined operating parameters.

In an embodiment, the power amplifier model may be determined 306 on the basis of power amplifiers' outputs measured in several parts over time for different beamforming factors applied to the radio signals.

In an embodiment, at least part of the power amplifiers' output signals may be combined into a combined power amplifiers' output signal and the combined power amplifiers' output signal may be measured for determining 306 the power amplifier model.

Predistortion parameters may be determined 308 such that after the operating parameters of the power amplifiers have been adjusted, errors in power amplifiers' outputs are reduced. The errors may be determined with respect to a defined cost function. The cost function may be frequency dependent, e.g. frequency weighted.

The method may end 310 after the predistortion parameters have been determined.

Figure 4:
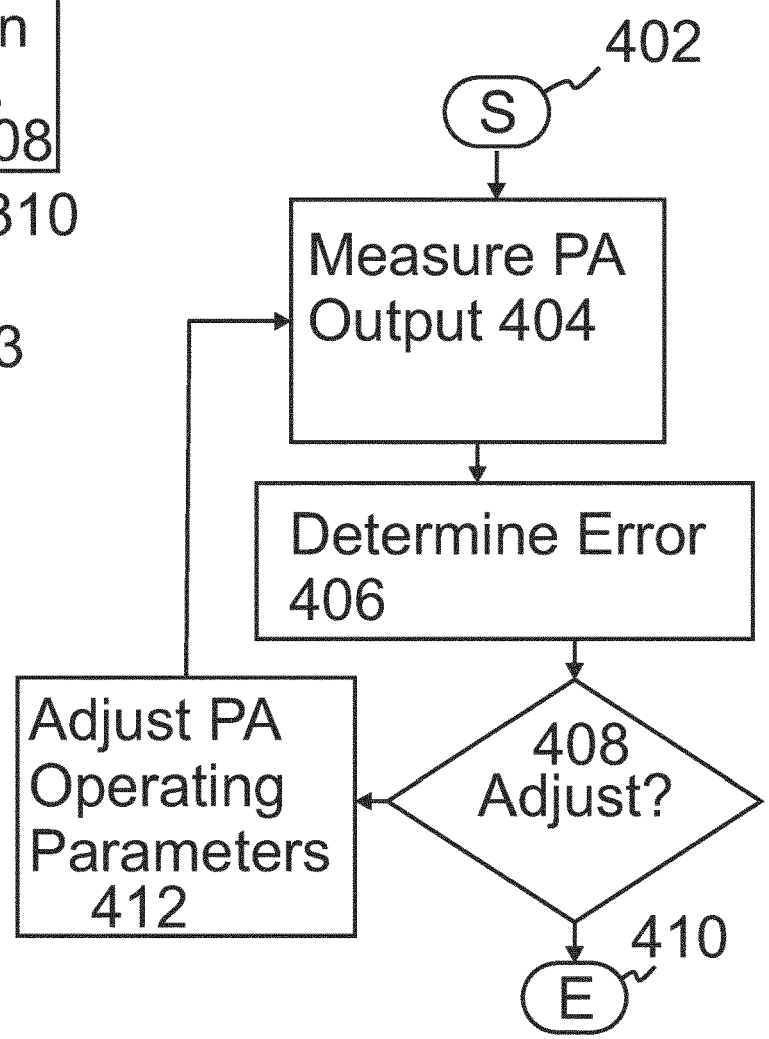
FIG. 4 illustrates a method for adjusting operating parameters of the power amplifiers in an analogue/hybrid beamforming system, according to an embodiment.

FIG. 4 illustrates a method for linearizing power amplifiers' outputs in an analogue/hybrid beamforming system, according to an embodiment. The method may be performed by an apparatus according to FIG. 1 or 2, for example.

The method may start 402, when the analogue/hybrid beamforming system is operational and power amplifiers' outputs may be obtained.

Power amplifiers' outputs may be measured 404.

In an embodiment, a power amplifier or a group of power amplifiers having the highest signal input power may be determined on the basis of the measured power amplifiers' outputs.

An error of the power amplifiers outputs may be determined 406. The error may be determined with respect to a defined cost function. The cost function may be frequency dependent, e.g. frequency weighted. The error may be estimated by a minimum means squared error (MMSE) method which minimizes the minimum mean square error.

In an embodiment, the power amplifiers' outputs may be grouped in different categories depending on the respective usage of the data or target functionalities. In each group, the feedbacks are combined coherently and linearly. The output from each group may be chosen by an RF switch and measured. As a result of this new architecture, the number of RF switches can be minimized. In addition, time-multiplexing the feedbacks falling within a group is overcome. Hence, it is now possible for the system to react and adapt much faster with respect to changes in its operating conditions.

Each combined group of PA output signals forms a Multiple Input Single Output (MISO) system with generic input and isolated output combiner. Hence, the contributions of to the input branches to the MISO are combined linearly and independently. This is described as:

$$1.\ y_\mu = \sum_{i=1}^{M} y_{i\mu} = \sum_{i=1}^{M} H_i(\alpha_{i\mu} x_\mu) * \theta_i = [H_1 \ \ldots \ H_M] * \begin{bmatrix} \theta_1 \\ \vdots \\ \theta_M \end{bmatrix} = H\theta$$

where vector signal $y_{i\square}$ of size N samples is the output of PA i. and the output of PA is a nonlinear dynamic function of its input vector signal $x_\square$. $H_i(\square_\square x_\square)$ is the regression matrix of a generic nonlinear dynamic model of pipe i under excitation signal $\square_\square x_\blacktriangle$ and $\theta_i$ the respective model parameters vector of PA i in the signal combiner structure. The parameters $\square_\square$ (denote the beamforming factor at the time index $\square$. We consider multiple time index $\square$ in the following. Due to the variation of parameters $\square_\square$ versus time over the different pipes M, the matrix H*His invertible.

Formulation (1) is linear in parameters and can be solved in the least square sense by inverting the correlation regression matrix H*H as:

$$\hat{\theta} = (H^*H)^{-1} H^* y \qquad 2.$$

The contribution of each pipe can then be calculated as:

$$\hat{y}_{i\mu} = H_i * \hat{\theta}_i \qquad 3.$$

If 408 the operating parameters should be adjusted the method may proceed to adjusting 412 the operating parameters of the power amplifiers towards the determined power amplifier model such that all the power amplifiers have substantially similar non-linear behavior. It should be appreciated that the linear/nonlinear frequency dependency of the behavior can change for different supply and bias, whereby the non-linear behavior may be referred to non-linear dynamic behavior.

In an embodiment, operating parameters of the power amplifier may comprise a supply voltage/current or bias voltage/current. Accordingly, in various embodiments described herein, instead of supply voltage or bias voltage, the supply current or bias current of the power amplifier may be adjusted 412.

In an embodiment, a power amplifier or a group of power amplifiers having the highest signal input power may be determined 404 on the basis of the power amplifiers' outputs; and operating parameters of the power amplifiers may be adjusted 412 on the basis of the model of the power amplifier having the highest signal input power. In this way the power amplifiers may be adjusted such that the power amplifiers are more similar to the power amplifier operating at the highest input signal power. Particularly, when the power amplifier having the highest signal input power is operated in a non-linear region of operation, the other power amplifiers may be adjusted to have similar non-linear operation with the power amplifier having the highest input signal power.

In an embodiment, adjusting 412 the operating parameters of the power amplifiers may comprise reducing a supply voltage of one or more of the other power amplifiers than the power amplifier having the highest signal input power. New predistortion parameters may be determined 308 on the basis of the power amplifiers' outputs measured when the power amplifiers are operated using the reduced supply voltages. The steps of determining 404 the power amplifier or a group of power amplifiers having the highest signal input power and adjusting 412 the operating parameters may be repeated. In this way the predistortion parameters and the operating parameters of the other power amplifiers may be adjusted such that the power amplifiers are more similar to the power amplifier operating at the highest input signal power. Particularly, when the power amplifier having the highest signal input power is operated in a non-linear region of operation, the predistortion parameters and the other power amplifiers may be adjusted to have similar non-linear operation with the power amplifier having the highest input signal power.

In an embodiment, adjusting the operating parameters of the power amplifiers may comprise reducing a supply voltage of one or more of the other power amplifiers than the power amplifier having the highest output power. New predistortion parameters may be determined 308 on the basis of the power amplifiers' outputs measured when the power amplifiers are operated using the reduced supply voltages, and the steps of determining 404 the power amplifier or a group of power amplifiers having the highest signal input power and adjusting 412 the operating parameters may be repeated.

It should be appreciated that in adjusting the operating parameters of the power amplifiers, preferably the operating parameters of the power amplifier having the highest input signal power should not be reduced when the power amplifier having the highest input signal power is operating in a non-linear region of operation, for example near saturation region or in a saturation region. The non-linear operation may be determined on the basis of clipping to voltage/current swings in the input signal to the power amplifier.

Preferably, in adjusting the operating parameters of the power amplifiers, the operating parameters of the other power amplifiers than the power amplifier having the highest input signal power are adjusted, since they have lower input signal powers than the power amplifier having the highest input signal power. Thereby, they have enough margin for their voltage/current swing to occur without clipping. Accordingly, the other power amplifiers' supply and/or bias voltage may be reduced to reduce their swing margin which will lead to clipping and nonlinear behavior of the power amplifiers. In this way the other power amplifiers may be made behaving like the power amplifier with high input signal power.

If the operating parameters should not be adjusted, the method may end 410. The decision whether the operating parameters should be adjusted or not may be made on the basis of the amount of the error. For example a threshold value may be defined for the error such that when the error is greater than the threshold the method may proceed to adjusting the operating parameters of the power amplifiers and when the error is less or equal to the threshold, the operating parameters of the power amplifiers and the predistortion parameters for power efficient and simple structure for linearizing the power amplifiers' outputs in the analogue/hybrid beamforming system have been determined and the method may end 410.

The steps/points, and related functions described above in FIGS. 3 and 4 are in no absolute chronological order, and some of the steps/points may be performed simultaneously or in an order differing from the given one. Other functions can also be executed between the steps/points or within the steps/points and other signaling messages sent between the illustrated messages. Some of the steps/points or part of the steps/points can also be left out or replaced by a corresponding step/point or part of the step/point.

Figure 5:
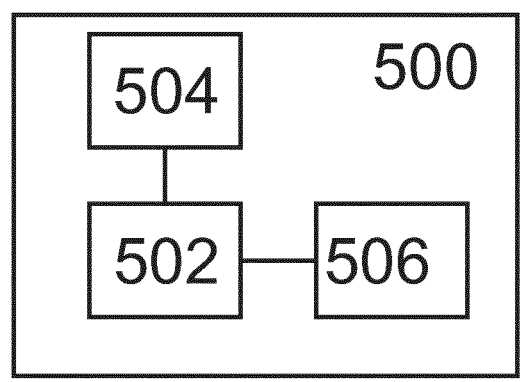
FIG. 5 illustrates an apparatus according to an embodiment.

FIG. 5 illustrates an apparatus 500 according to an embodiment. The apparatus may comprise a processor 502 and a memory 504 for storing a computer program code and an interface to one or more units of -analogue/hybrid beamforming system. The processor, memory and the analogue/hybrid beamforming system may be operatively connected to cause execution of one or more functionalities according to an embodiment. Connections between the units of the apparatus may be electrical connections which may be implemented by electrical wiring and conductors on a circuit board for example. The connections may be digital or analogue connections and conversions between digital and analogue connections may be provided by conversion circuitry as necessary.

It should be appreciated that the processor and the memory may be incorporated in at least one of the units of the analogue/hybrid beamforming system, whereby separate processor and memory and memory may not be needed.

An apparatus 500 according to an embodiment may be implemented as an electronic digital computer, which may comprise a working memory (RAM), a central processing unit (CPU), and a system clock. The CPU may comprise a set of registers, an arithmetic logic unit, and a control unit. The control unit is controlled by a sequence of program instructions transferred to the CPU from the RAM. The control unit may contain a number of microinstructions for basic operations. The implementation of microinstructions may vary, depending on the CPU design. The program instructions may be coded by a programming language, which may be a high-level programming language, such as C, Java, etc., or a low-level programming language, such as a machine language, or an assembler. The electronic digital computer may also have an operating system, which may provide system services to a computer program written with the program instructions. The memory may be a volatile or a non-volatile memory, for example EEPROM, ROM, PROM, RAM, DRAM, SRAM, firmware, programmable logic, etc.

An embodiment provides a computer program embodied on a distribution medium, comprising program instructions which, when loaded into an electronic apparatus 500, constitute one or more entities of an analogue/hybrid beamforming system according to an embodiment.

The computer program may be in source code form, object code form, or in some intermediate form, and it may be stored in some sort of carrier, which may be any entity or device capable of carrying the program. Such carriers include a non-transitory computer readable storage medium, a record medium, computer memory, read-only memory, electrical carrier signal, telecommunications signal, and software distribution package, for example. Depending on the processing power needed, the computer program may be executed in a single electronic digital computer or it may be distributed amongst a number of computers.

The apparatus 500 may also be implemented as one or more integrated circuits, such as application-specific integrated circuits ASIC, software routines and/or programmable circuits. Other hardware embodiments are also feasible, such as a circuit built of separate logic components. A hybrid of these different implementations is also feasible. When selecting the method of implementation, a person skilled in the art will consider the requirements set for the size and power consumption of the apparatus, necessary processing capacity, production costs, and production volumes, for example.

Apparatuses, such as analogue/hybrid beamforming systems, or corresponding components and/or other corresponding devices or apparatuses implementing the functionality of a corresponding apparatus described with an embodiment comprise not only prior art means, but also means for obtaining beamforming factors for controlling transmission beams of the antennas, determining at least one power amplifier model on the basis of the power amplifiers' outputs and the beamforming factors, and determining predistortion parameters such that after the operating parameters of the power amplifiers have been adjusted, errors in power amplifiers' outputs are reduced.

More precisely, the various means comprise means for implementing functionality of a corresponding apparatus described with an embodiment and it may comprise separate means for each separate function, or means may be configured to perform two or more functions. Present apparatuses comprise processors and memory that can be utilized in an embodiment.

The apparatus 500, such as an analogue/hybrid beamforming system may be configured as a computer or a microprocessor, such as single-chip computer element, including at least a memory for providing storage area used for arithmetic operation and an operation processor for executing the arithmetic operation. An example of the operation processor includes a central processing unit. The memory may be removable memory detachably connected to the apparatus.

For example, an apparatus according to an embodiment may be implemented in hardware (one or more apparatuses), firmware (one or more apparatuses), software (one or more modules), or combinations thereof. For a firmware or software, implementation can be through modules (e.g., procedures, functions, and so on) that perform the functions described herein. The software codes may be stored in any suitable, processor/computer-readable data storage medium(s) or memory unit(s) or article(s) of manufacture and executed by one or more processors/computers. The data storage medium or the memory unit may be implemented within the processor/computer or external to the processor/computer, in which case it can be communicatively coupled to the processor/computer via various means as is known in the art.

It will be obvious to a person skilled in the art that, as the technology advances, the inventive concept can be implemented in various ways. The invention and its embodiments are not limited to the examples described above but may vary within the scope of the claims.

The invention claimed is:

1. An apparatus, comprising:
parallel power amplifiers controllable by beamforming factors for feeding antennas;
phase and magnitude shifters, said phase and magnitude shifters being arranged to adjust phase and magnitude of radio signals fed to the power amplifiers;
at least one processor and a memory storing computer program code, wherein the memory and the computer program code are configured, with the at least one processor, to cause the apparatus to perform operations comprising:
implementing beamforming to determine the beamforming factors for controlling transmission beams of antennas in an analogue/hybrid beamforming system;
implementing digital predistortion controllable by a single predistortion model for feeding a predistorted signal to the power amplifiers for linearizing the power amplifiers' outputs;
implementing power amplifier control to determine operating parameters for the power amplifiers on the basis of beamforming factors;
determining at least one power amplifier model on the basis of the power amplifiers' outputs and the beamforming factors; and
determining predistortion parameters such that after the operating parameters of the power amplifiers have been adjusted, errors in power amplifiers' outputs are reduced according to a cost function.

2. An apparatus according to claim 1, wherein the operating parameters of the power amplifiers are adjusted towards the determined power amplifier model such that all the power amplifiers have substantially similar non-linear dynamic behavior.

3. An apparatus according to claim 1, wherein the power amplifier model is determined on the basis of power amplifiers' outputs measured in several parts over time for different beamforming factors applied to the radio signals.

4. An apparatus according to claim 1, wherein at least part of the power amplifiers' output signals are combined into a combined power amplifiers' output signal and the combined power amplifiers' output signal is measured for determining the power amplifier model.

5. An apparatus according to claim 1, wherein power amplifiers' outputs are grouped in different categories based on respective usage of the power amplifiers' output or target functionalities.

6. An apparatus according to claim 5, wherein output of each group is selectable by an RF switch for measuring the output.

7. An apparatus according to claim 6, wherein
the power amplifier or a group of power amplifiers having a highest signal input power is determined on a basis of the power amplifiers' outputs; and
operating parameters of the power amplifiers are adjusted on a basis of the model of the power amplifier having the highest signal input power.

8. An apparatus according to claim 7, wherein:
adjusting the operating parameters of the power amplifiers comprises reducing a supply voltage/current or bias voltage/current of at least one other power amplifier than the power amplifier having the highest signal input power;

new predistortion parameters are determined on the basis of the power amplifiers' outputs measured when the power amplifiers are operated using the reduced supply voltage/current or bias voltage/current; and there is a repetition of the following: the power amplifier or the group of power amplifiers having the highest signal input power is determined on the basis of the power amplifier's outputs, and the operating parameters of the having the highest signal input power.

9. An apparatus according to claim 1, wherein the operating parameters comprise a supply voltage/current or bias voltage/current.

10. A method comprising:

implementing beamforming to determine beamforming factors for controlling transmission beams of antennas in an analogue/hybrid beamforming system;

controlling parallel power amplifiers controllable by the beamforming factors for feeding antennas;

controlling phase and magnitude shifters, said phase and magnitude shifters being arranged to adjust phase and magnitude of radio signals fed to the power amplifiers;

implementing digital predistortion controllable by a single predistortion model for feeding a predistorted signal to the power amplifiers for linearizing the power amplifiers' outputs;

implementing power amplifier control to determine operating parameters for the power amplifiers on the basis of beamforming factors;

determining at least one power amplifier model on a basis of the power amplifiers' outputs and the beamforming factors; and determining predistortion parameters such that after the operating parameters of the power amplifiers have been adjusted, errors in power amplifiers' outputs are reduced according to a cost function.

11. A computer program comprising a non-transitory computer program product having program instructions executable in an apparatus to cause the apparatus to perform operations comprising:

implementing beamforming to determine beamforming factors for controlling transmission beams of antennas in an analogue/hybrid beamforming system;

controlling parallel power amplifiers controllable by the beamforming factors for feeding antennas;

controlling phase and magnitude shifters prior to the power amplifiers, said phase and magnitude shifters being arranged to adjust the phase and magnitude of the radio signals fed to the power amplifiers;

implementing digital predistortion controllable by a single predistortion model for of feeding a predistorted signal to the power amplifiers for linearizing the power amplifiers' outputs;

implementing power amplifier control to determine operating parameters for the power amplifiers on the basis of beamforming factors;

determining at least one power amplifier model on the basis of the power amplifiers' outputs and the beamforming factors; and determining predistortion parameters such that after the operating parameters of the power amplifiers have been adjusted, errors in power amplifiers' outputs are reduced according to a cost function.

12. A method according to claim 10, wherein the operating parameters of the power amplifiers are adjusted towards the determined power amplifier model such that all the power amplifiers have substantially similar non-linear dynamic behavior.

13. A method according to claim 10, wherein the power amplifier model is determined on the basis of power amplifiers' outputs measured in several parts over time for different beamforming factors applied to the radio signals.

14. A method according to claim 10, wherein at least part of the power amplifiers' output signals are combined into a combined power amplifiers' output signal and the combined power amplifiers' output signal is measured for determining the power amplifier model.

15. A method according to claim 10, wherein power amplifiers' outputs are grouped in different categories based on respective usage of the power amplifiers' output or target functionalities.

16. A method according to claim 15, wherein output of each group is selectable by an RF switch for measuring the output.

17. A method according to claim 16, wherein the power amplifier or a group of power amplifiers having a highest signal input power is determined on a basis of the power amplifiers' outputs; and operating parameters of the power amplifiers are adjusted on a basis of the model of the power amplifier having the highest signal input power.

18. A method according to claim 17, wherein:

adjusting the operating parameters of the power amplifiers comprises reducing a supply voltage/current or bias voltage/current of at least one other power amplifier than the power amplifier having the highest signal input power;

new predistortion parameters are determined on the basis of the power amplifiers' outputs measured when the power amplifiers are operated using the reduced supply voltage/current or bias voltage/current; and there is a repetition of the following: the power amplifier or the group of power amplifiers' outputs, and the operating parameters of the power amplifiers are adjusted on the basis of the model of the power amplifier having the highest signal input power.

19. A method according to claim 10, wherein the operating parameters comprise a supply voltage/current or bias voltage/current.

* * * * *